United States Patent
Kline (10) Patent No.: US 9,644,253 B2
(45) Date of Patent: May 9, 2017

(54) MITIGATION AND ELIMINATION OF TIN WHISKERS

(71) Applicant: International Business Machines Corporation, Armonk, NY (US)

(72) Inventor: Eric V. Kline, Rochester, MN (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 596 days.

(21) Appl. No.: 14/072,077

(22) Filed: Nov. 5, 2013

(65) Prior Publication Data

US 2014/0060907 A1 Mar. 6, 2014

Related U.S. Application Data

(63) Continuation of application No. 12/907,923, filed on Oct. 19, 2010, now abandoned.

(51) Int. Cl.
*C23C 8/10* (2006.01)
*C23C 10/08* (2006.01)
*C23C 10/28* (2006.01)
*C23C 26/00* (2006.01)
*H05K 3/34* (2006.01)
(Continued)

(52) U.S. Cl.
CPC ............... *C23C 8/10* (2013.01); *C23C 10/08* (2013.01); *C23C 10/28* (2013.01); *C23C 26/00* (2013.01); *H05K 1/09* (2013.01); *H05K 3/04* (2013.01); *H05K 3/34* (2013.01);
(Continued)

(58) Field of Classification Search
CPC C23C 8/10; C23C 10/08; C23C 10/28; C23C 26/00; H05K 3/04; H05K 3/34; H05K 1/09; H05K 2201/10977; H05K 2203/0315; Y10T 29/49124
See application file for complete search history.

(56) References Cited

U.S. PATENT DOCUMENTS 4,749,626 A 6/1988 Kadija et al.
4,959,278 A 9/1990 Shimauchi et al.
(Continued)

FOREIGN PATENT DOCUMENTS

JP 2006111898 4/2006

OTHER PUBLICATIONS

G. W. Stupian, "Tin Whiskers in Electronic Circuits", Dec. 20, 1992, The Aerospace Corporation, Aerospace Report No. TR-92(2925)-7.*

(Continued)

*Primary Examiner* — Peter DungBa Vo
*Assistant Examiner* — Jeffrey T Carley
(74) *Attorney, Agent, or Firm* — Kunzler Law Group (57) ABSTRACT

A method includes providing an electronic assembly, where the electronic assembly has at least one electrical connection that includes at least a surface that is substantially pure tin metal and the pure tin metal has tin whiskers formed thereon and the pure tin metal has a thickness. The method includes exposing the tin metal to at least one mitigating agent selected to interact with the tin metal to oxidize the tin whiskers and mechanically removing substantially all the oxidized tin whiskers from the electronic assembly. The electronic assembly is exposed to the mitigating agent under appropriate conditions to oxidize the tin whiskers.

26 Claims, 4 Drawing Sheets

(51) Int. Cl.
 *H05K 1/09* (2006.01)
 *H05K 3/04* (2006.01)
(52) U.S. Cl.
 CPC .............. *H05K 2201/10977* (2013.01); *H05K 2203/0315* (2013.01); *Y10T 29/49124* (2015.01)

(56) References Cited

U.S. PATENT DOCUMENTS

| | | | |
|---|---|---|---|
| 5,393,573 | A | 2/1995 | MacKay |
| 5,730,851 | A | 3/1998 | Arrowsmith et al. |
| 6,361,823 | B1 | 3/2002 | Bokisa et al. |
| 7,547,479 | B2 | 6/2009 | Wessling |
| 2002/0187364 | A1 | 12/2002 | Heber et al. |
| 2002/0192492 | A1* | 12/2002 | Abys ............... C23C 26/00 428/647 |
| 2003/0129441 | A1 | 7/2003 | Hara et al. |
| 2003/0201188 | A1 | 10/2003 | Schetty, III et al. |
| 2005/0106408 | A1 | 5/2005 | Chen et al. |
| 2005/0145502 | A1 | 7/2005 | Schetty, III et al. |
| 2006/0292847 | A1 | 12/2006 | Schetty, III |
| 2007/0117475 | A1 | 5/2007 | Tu |
| 2008/0173550 | A1 | 7/2008 | Kiso et al. |
| 2009/0014027 | A1* | 1/2009 | Schriever ............. B08B 5/00 134/1.1 |
| 2009/0286383 | A1* | 11/2009 | Jiang ............... B22F 1/0025 438/478 |
| 2010/0089982 | A1 | 4/2010 | Sakuyama |

OTHER PUBLICATIONS

G.W. Stupian, Tin Whiskers in Electronic Circuits, Dec. 20, 1992, 28 pages.
Governement Electronics and Information Technology Association, Standard for Mitigating the Effects of Tin Whiskers in Aerospace and High Performance Electronic Systems, Jun. 2006, 46 pages.
Dittes et al., "Tin Whisker Formation—Results, Test Methods and Countermeasures", Electronic Components and Technology Conference, May 27-30, 2003, 5 pages.
STMicroelectronics, "Control of whisker growth in Tin alloy coating" AN2035—Application note, Apr. 2006, 11 pages.
NASA, "Basic Information Regarding Tin Whiskers" http://nepp.nasa.gov/whisker/background/index.htm, accessed Jul. 6, 2011, publication date unknown, 7 pages.
STMicroelectronics, "Keyword Search Results—Tin Whisker", http://www.st.com/internet/com/search/search.jsp?q=tin whisker&entqr=3&entsp=a&output=xml_no_dtd&sort=date:D:L:d1&client=ST_COM_PlanA_frontend&ud=1&oe=UTF-8&ie=UTF-8&ie=UTF-8&proxystylesheet=ST_COM_PlanA_frontend&site=ST_COM, accessed on Jul. 6, 2011, publication date unknown, 1 page.
U.S. Appl. No. 12/907,923 Office Action mailed Feb. 1, 2013.
U.S. Appl. No. 12/907,923 Final Office Action mailed Aug. 26, 2013.
U.S. Appl. No. 13/663,327, filed Oct. 29, 2012, Office Action Mailed Jan. 26, 2016.

* cited by examiner

MITIGATION AND ELIMINATION OF TIN WHISKERS

CROSS-REFERENCE TO RELATED APPLICATIONS

This is a continuation application of and claims priority to U.S. patent application Ser. No. 12/907,923 entitled "MITIGATION AND ELIMINATION OF TIN WHISKERS" and filed on Oct. 19, 2010 for Eric V. Kline, which is incorporated herein by reference for all purposes.

FIELD

The present invention relates to the manufacture of electronic assemblies, and more specifically, to the prevention and/or removal of tin whiskers on the electronic assemblies.

BACKGROUND

According to one embodiment of the present invention, the formation of tin whiskers may be addressed via the conversion of tin metal in the electronic assembly to a material that is resistant to forming whiskers. This conversion may occur via treatment of the electronic assembly with a mitigating agent that interacts with the tin metal present, or via incorporation of an electronic assembly with a mitigating agent that interacts with tin metal.

BRIEF SUMMARY

In one embodiment, the present invention includes a method of mitigating tin whisker formation on electronic assemblies that includes providing an electronic assembly that includes an electrical connection having at least a surface that is substantially pure tin metal, exposing the tin metal to a mitigating agent. That mitigating agent is selected to interact with the tin metal, under appropriate conditions that promote the desired interaction, thereby to produce a product that is resistant to forming whiskers.

In one embodiment, the method includes mechanically removing substantially all the oxidized tin whiskers from the electronic assembly. In another embodiment, the mitigating agent is a reagent, and the interaction with the tin metal is a chemical reaction. In another embodiment, the mitigating agent is oxygen, and the interaction with tin metal is oxidation of the tin metal to at least one of SnO and $SnO_2$. In another embodiment, the appropriate conditions include heating the electronic assembly above room temperature. In another embodiment, the appropriate conditions include heating the electronic assembly to between about 25° C. and about 90° C.

In another embodiment, the appropriate conditions are sufficient to convert the tin metal surface of the at least one electrical connection to a product that is resistant to forming whiskers. In another embodiment, the appropriate conditions are sufficient to convert the surface and entire thickness of the at least one electrical connection to a product that is resistant to forming whiskers. In another embodiment, the mitigating agent is applied to the electronic assembly as one or more of a vapor and liquid. In another embodiment, a first mitigating agent is a reagent that interacts with the tin metal in a chemical reaction at the surface of the tin metal, and a second mitigating agent is a metal film disposed between the tin metal and the at least one electrical connection that interacts with an underside of the tin metal to form a tin alloy that is resistant to forming whiskers.

In one embodiment, mechanically removing substantially all the oxidized tin whiskers from the electronic assembly includes vibrating the electronic assembly at a frequency and amplitude that the oxidized tin whiskers break free of the electronic assembly. In another embodiment, the method includes exposing the oxidized tin whiskers to a vacuum sufficient to remove one or more of oxidized tin whiskers separated from the electronic assembly and oxidized tin whiskers attached to the electronic assembly. In another embodiment, mechanically removing substantially all the oxidized tin whiskers from the electronic assembly includes exposing the oxidized tin whiskers to a jet of high velocity gas. In another embodiment, mechanically removing substantially all the oxidized tin whiskers from the electronic assembly includes exposing the oxidized tin whiskers to a vacuum, the vacuum causing gas surrounding the oxidized whiskers to move past the oxidized tin whiskers with a velocity sufficient to remove the oxidized tin whiskers.

Another embodiment of a method includes providing an electronic assembly. The electronic assembly has at least one electrical connection that includes at least a surface that is substantially pure tin metal. The pure tin metal has tin whiskers formed thereon and the pure tin metal has a thickness. The method includes heating the electronic assembly to between about 25° C. and about 90° C. and exposing the tin metal to at least one mitigating agent selected to interact with the tin metal to oxidize the tin whiskers. The mitigating agent includes oxygen and the interaction with the tin metal is a chemical reaction that includes oxidation of the tin metal to at least one of SnO and $SnO_2$. The method includes mechanically removing substantially all the oxidized tin whiskers from the electronic assembly.

In one embodiment, mechanically removing substantially all the oxidized tin whiskers from the electronic assembly includes vibrating the electronic assembly at a frequency and amplitude that the oxidized tin whiskers break free of the electronic assembly. In another embodiment, mechanically removing substantially all the oxidized tin whiskers from the electronic assembly includes exposing the oxidized tin whiskers to a jet of high velocity gas. In another embodiment, mechanically removing substantially all the oxidized tin whiskers from the electronic assembly includes exposing the oxidized tin whiskers to a vacuum, the vacuum causing gas surrounding the oxidized whiskers to move past the oxidized tin whiskers with a velocity sufficient to remove the oxidized tin whiskers.

In another embodiment of the present invention, a whisker-resistant electronic assembly may be prepared by providing an electronic assembly that has an electrical connection that includes substantially pure tin metal, exposing the tin metal to a mitigating agent selected to interact with the tin metal to produce a product that is resistant to forming whiskers, and curing the electronic assembly under conditions selected to promote the desired interaction.

In yet another embodiment of the present invention, an electronic assembly may include a circuit board substrate, a conducting trace that includes copper metal, and an electrical component coupled to the conducting trace via tin metal, where the conducting trace and the tin metal are coupled via a mitigating metal including at least one of gallium, indium, gold, copper, aluminum, silver, magnesium, nickel, zinc, and lead, provided the mitigating metal is present in sufficient quantity that upon heating, the mitigating metal substantially converts the tin solder to an alloy that resists whisker formation.

DETAILED DESCRIPTION OF THE INVENTION

Figure 1:
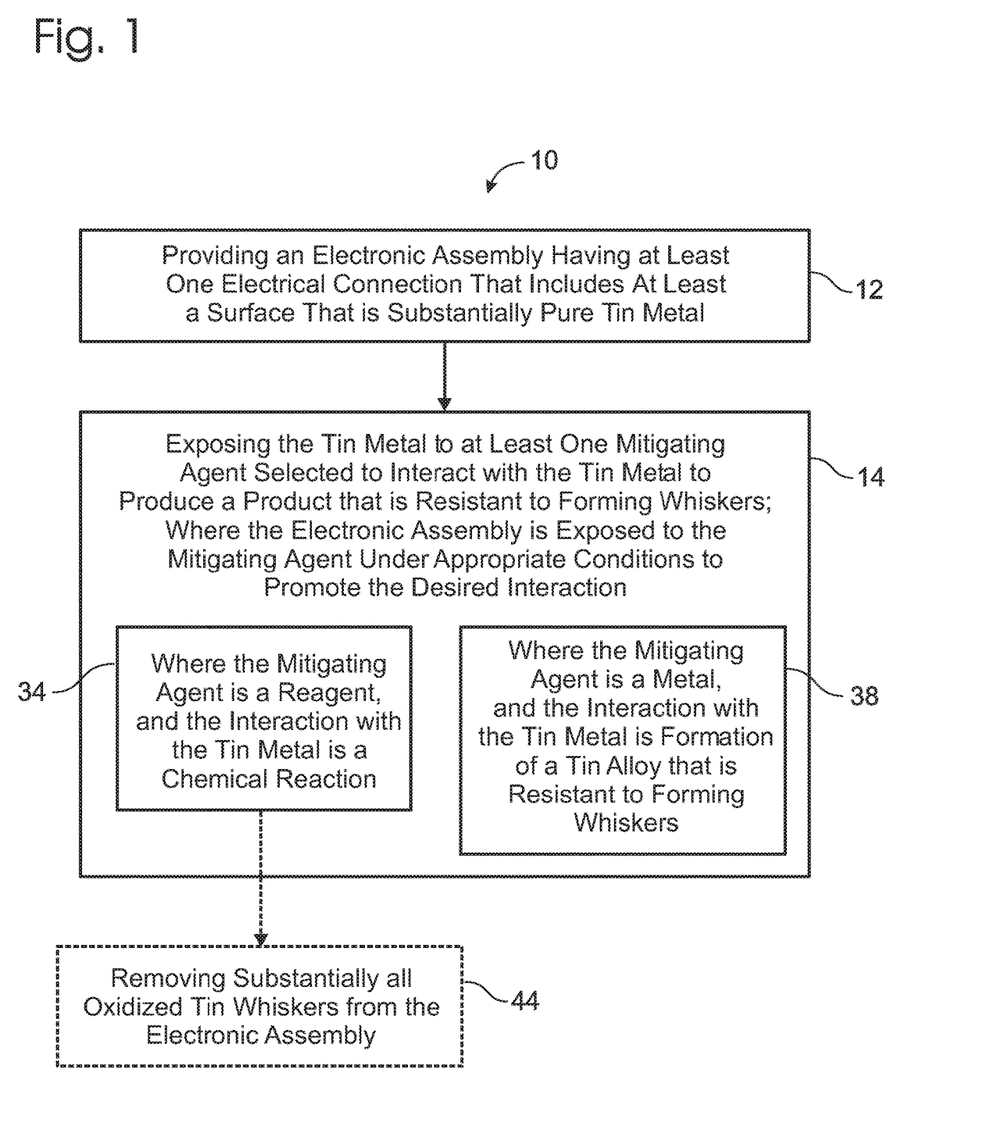
FIG. 1 includes a flowchart that illustrates an exemplary embodiment of a method of mitigating tin whisker formation according to the present invention.

FIG. 1 depicts a flowchart 10 setting out a method of mitigating tin whisker formation in an electronic assembly. The method includes providing an electronic assembly that has at least one electrical connection that includes at least one surface that is substantially pure tin metal, as shown at 12. Specifically, the method includes exposing the tin metal to at least one mitigating agent that is selected to interact with the tin metal to produce a product that is resistant to forming whiskers, where the electronic assembly is exposed to the mitigating agent under appropriate conditions to promote the desired interaction, as shown at 14.

Figure 2:
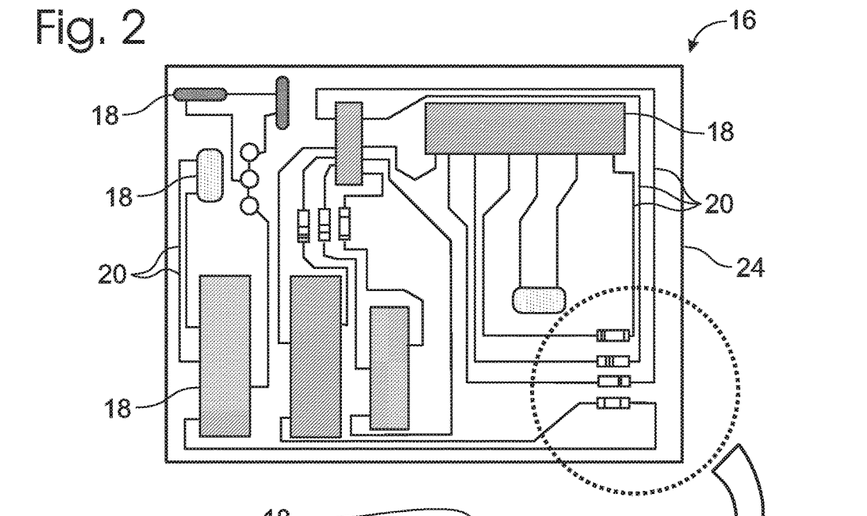
FIG. 2 includes a plan view of a schematic representing an exemplary embodiment of an electronic assembly according to the present invention.

A schematic depicting an exemplary electronic assembly 16 is shown in FIG. 2. As used herein, an electronic assembly 16 is a collection of one or more electronic components 18 that are electrically connected to a conductive pathway, track, or signal trace, 20. The electronic assemblies discussed in this disclosure typically include at least one electrical connection 22 that includes at least one surface that is substantially pure tin metal. Typically, the electronic assembly includes a nonconductive substrate 24 that supports the one or more electronic components, as well as the electrical connection. In one embodiment, the electronic assembly includes a substrate that is a printed circuit board, or PCB, that mechanically supports and electrically connects the electronic components using conductive pathways, tracks or signal traces. In another particular embodiment, the electronic assembly corresponds to a printed circuit board and a specified arrangement of one or more electronic components prior to a solder reflow process. In another particular embodiment, the electronic assembly corresponds to a printed circuit board and a specified arrangement of one or more electronic components after a solder reflow process.

The printed circuit board may be prepared by bonding a thin layer of a conductive metal onto the substrate, and then removing unwanted metal by masking and etching. Alternatively, the printed circuit board may be prepared by adding conductive traces to the nonconductive substrate by a process of electroplating. The conducting traces typically include copper. A printed circuit board that supports and interconnects a plurality of electronic components may be referred to as a printed circuit board assembly, or PCBA.

As used herein, an electronic component 18 is an electronic element having two or more electrical connections. Electronic components are typically connected, such as by attachment to a printed circuit board, so as to create an electronic circuit with a particular desired function. Examples of electronic components include, for example, resistors, capacitors, transistors, diodes, fuses, inductors, transducers, and the like. Electronic components may also refer to more complex devices such as integrated circuits (or chips).

Figure 3:
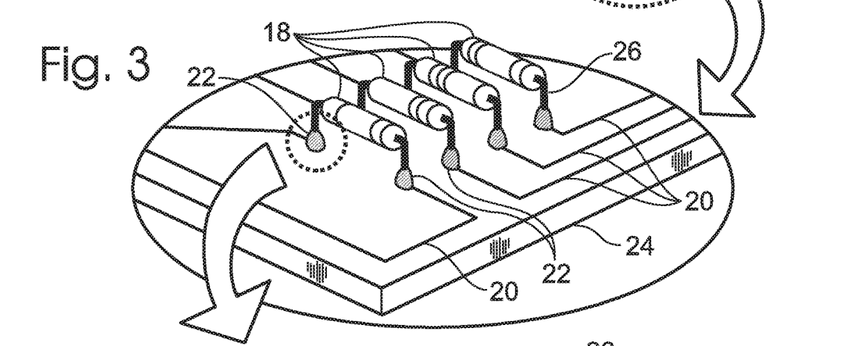
FIG. 3 depicts a detail of the electronic assembly of FIG. 2, in a perspective view.

A region of the electronic assembly 16 of FIG. 2 is shown in greater detail in FIG. 3. In FIG. 3, electronic components 18 include at least one electrical connection 22 between the electronic component 18 and conductive trace 20. Although the electrical connection typically is between an individual component and a conductive trace that is present on a printed circuit board, the specific nature of the electrical connection may vary widely. In general, any type of electrical connection that results in a suitable electronic assembly for the purposes of the instant method is an appropriate electrical connection.

Figure 4:
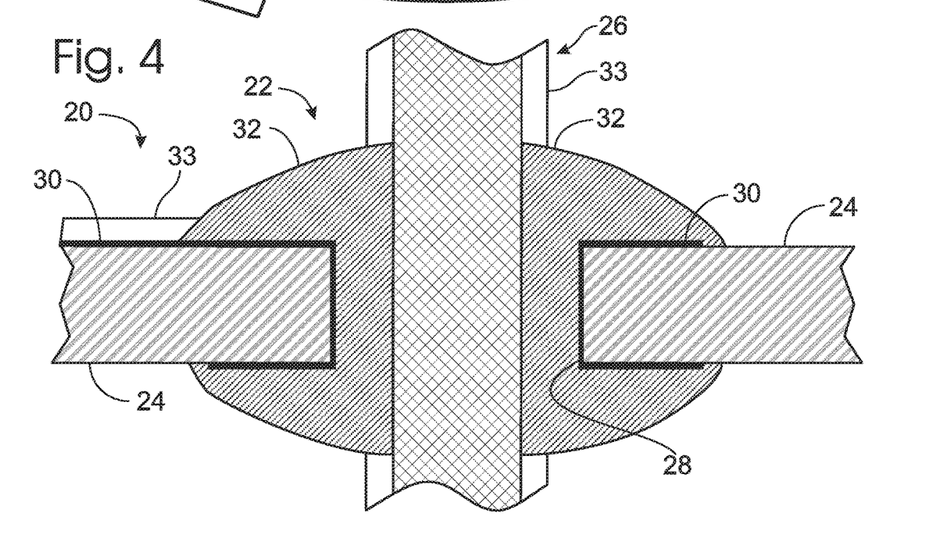
FIG. 4 includes a cross-sectional view of a detail of an electronic connection in the electronic assembly of FIG. 3, after preparation but prior to curing of that assembly.

As shown in FIG. 3, and in greater detail in the cross-sectional view of FIG. 4, electrical connection 22 may include one or more leads 26 of a given component through an aperture or hole 28 formed in substrate 24, where the sides of the hole may include copper metal 30 (through-hole assembly). Alternatively, the leads of a given electronic component may be placed on lands or pads on a PCB. In either case, the component leads are subsequently fixed to the circuit board with a soft metal solder. In yet another alternative aspect, the electronic component may be connected to a printed circuit board via one or more balls of solder, for example via a ball grid array, where the component is a chip, a chip array, a flip chip, and the like.

The solder used to form the electrical connections in the electronic assembly typically includes both tin and lead metals. Tin/lead solders, however, are typically not susceptible to whisker formation. Only in relatively few cases is pure tin solder is used. In addition, electronic assemblies may include plain copper metal, such as typically makes up conductive traces. As the copper is prone to oxidation, the copper must be coated by a component finish, which is often a tin metal finish. In addition, a variety of electronic components may incorporate electrical connections that include pure tin metal, for example surface finishes of pure tin metal, and are therefore prone to tin whisker formation.

An exemplary connection 22 between an electronic component and a substrate 24 prior to curing of the electronic assembly is depicted schematically in FIG. 4, and includes metal solder 32 forming a connection between component lead 26 of a representative electronic component and a conductive trace 20 of copper 30 that extends around and within aperture 28 in substrate 24. Component lead 26 includes a representative component finish with a finishing layer 33 of pure tin metal, as does conductive trace 20 of copper metal 30 leading leftward from connection 22. In the absence of the appropriate conditions to promote the desired interaction with the selected mitigating agent, such as via a curing process, the pure tin metal of connection 22, present on both the component lead and the conductive traces, would remain susceptible to whisker formation and potential failure.

As discussed above with respect to FIG. 1, the method depicted in flowchart 10 includes exposing the tin metal present in an electrical connection of the electronic assembly to at least one mitigating agent selected to interact with the tin metal to produce a product that is resistant to forming whiskers (at 34 of flowchart 10). In one embodiment of the method, the mitigating agent is a reagent, such that exposing the tin metal of the electronic assembly to the reagent produces a reaction product that is resistant to forming whiskers. Typically, the interaction between the reagent and the tin metal is a chemical reaction, and occurs under conditions selected to promote the desired chemical reaction. Such conditions may include any combination of a preferred temperature or temperature range, a preferred applied pressure, applying the reagent as a solution, applying the reagent as a vapor, and/or applying the reagent in the presence of one or more additional reagents.

In one embodiment of the method, the reagent may be applied as a vapor or gas. Such an application may take place in a conventional vapor chamber, and may employ a procedure that includes placing the electronic assembly into the vapor chamber, purging the ambient atmosphere from the vapor chamber, exposing the electronic assembly to one or more desired reagents as gas or vapor for a time sufficient to convert the tin metal present to a product that is resistant to whisker formation, followed by venting or purging the reagent gas or vapor. This treatment of the electronic assembly is optionally combined with heating and/or cooling the electronic assembly.

Figure 5:
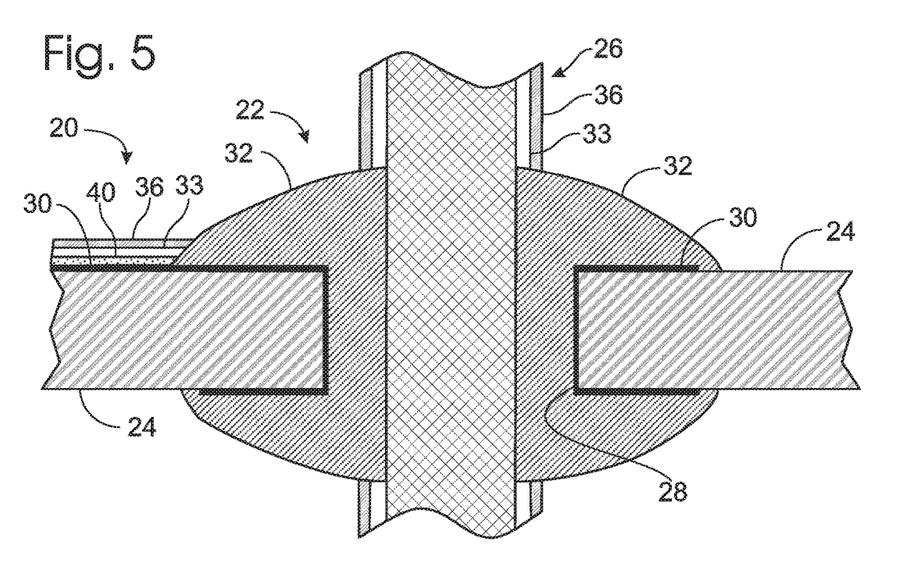
FIG. 5 is a detail of the electronic assembly of FIG. 4 during a curing process, showing partial conversion of tin metal to whisker-resistant products, according to an exemplary embodiment of the invention.
Figure 6:
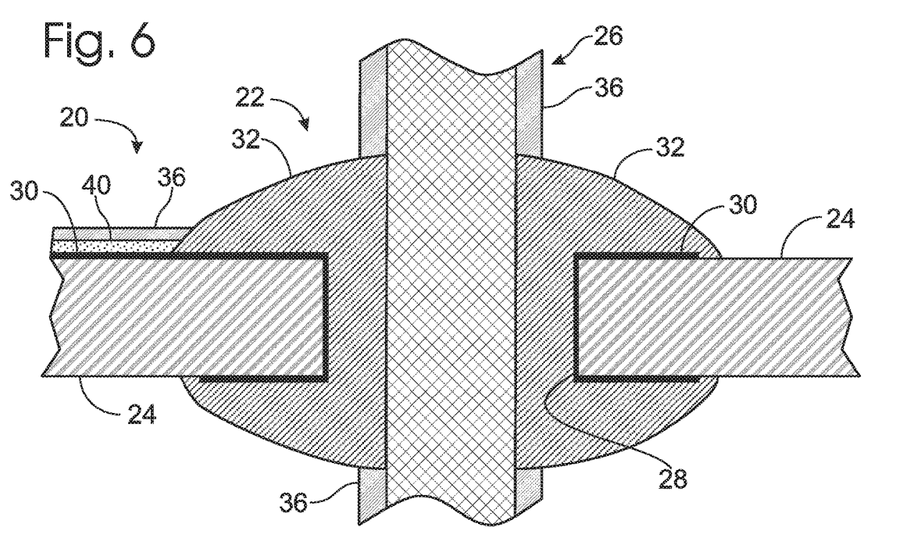
FIG. 6 is a detail of the electronic assembly of FIG. 4 after completing a curing process, and showing complete conversion of tin metal to whisker-resistant products, according to another exemplary embodiment of the invention.

In one embodiment of the method the mitigating agent is oxygen, and the interaction between the oxygen and the tin metal is an oxidation reaction. Typically, oxidation of tin metal according to the present method results in the formation of tin oxides, more specifically the formation of at least one of $SnO$ and $SnO_2$, which are resistant to whisker formation. The interaction of oxygen and the tin metal present on the electronic assembly may be facilitated by heating the electronic assembly above room temperature in the presence of oxygen. For example, the electronic assembly may be heated to between about 25° C. and about 90° C. to facilitate oxidation of tin metal. In another embodiment of the method the mitigating agent is chlorine gas, or other chlorinating agent, and the tin metal present in the electronic assembly is converted to tin (I) chloride and/or tin (II) chloride.

Where the tin metal of the electronic assembly is exposed to a reagent, the exposure conditions may be selected to convert a region of the tin metal surface to a product that is resistant to forming whiskers. That is, the exposed surfaces of pure tin metal present in the electronic assembly is passivated with respect to whisker formation by completely encapsulating the exposed tin metal with a layer, or skin, of the reaction product. An example of this type of surface mitigation is depicted in FIG. 5, where exposure to an appropriate mitigating reagent under appropriate conditions has converted a surface layer of tin metal 33 present on component lead 26 into a product 36 that is resistant to whisker formation. A similar conversion is shown for the silver finish present on conductive trace 20. This skin-forming process passivates the remainder of the pure tin metal present on component lead 26 with respect to whisker formation. At this point, mitigation may be halted or continued until substantially the entire thickness of the tin metal is converted to a whisker-resistant product (FIG. 6).

Where further conversion is desired, the exposure conditions and reagent used may be selected so that additional exposure to the mitigating reagent converts the entire thickness of tin metal to a whisker resistant product. As shown in FIG. 6, after the desired reaction and/or curing process is substantively complete, tin metal 33 present on component lead 26 of the electronic assembly has been converted to whisker-resistant product 36.

Alternatively, or in addition, as shown at 38 in FIG. 1, the disclosed method optionally includes exposing the tin metal present in an electrical connection of the electronic assembly to at least one mitigating agent that is a metal, with the interaction of the mitigating agent and the tin metal forming an alloy of tin that is resistant to forming whiskers.

In one embodiment of the invention, depicted in FIG. 4, the mitigating agent is a conducting layer of copper metal, such as copper metal 30 forming conductive trace 20 on substrate 24. In this embodiment, the formation of the alloy of tin includes the formation of one or more of $Cu_6Sn_5$ and $CuSn_3$, which alloys are not prone to forming whiskers. As depicted in FIG. 5, the interaction of tin metal 33 with copper metal 30 results in the partial conversion of the tin metal to whisker-resistant copper alloy 40 during the curing process.

In one particular embodiment of the invention, the electronic assembly interacts with at least two mitigating agents, as depicted in FIGS. 4-6. One of those agents is surface-interactive, resulting in a reaction that progresses inwardly into and throughout the tin phase until all the tin present is converted, while the other agent reacts to cause a conversion at the tin/metal interface from a tin material to a whisker-resistant alloy, with alloy formation then extending throughout the tin phase. Specifically, a first mitigating agent, such as an applied reagent, converts tin metal at an exposed tin metal surface, and proceeds throughout the contiguous tin phase. Internal to that surface, and at a metal-tin interface, there is an interaction of tin metal with the mitigating agent that simultaneously or sequentially converts the tin metal to a whisker-resistant alloy. Each conversion may proceed until all free tin has been converted to a whisker-resistant product, as shown in FIG. 6.

Figure 7:
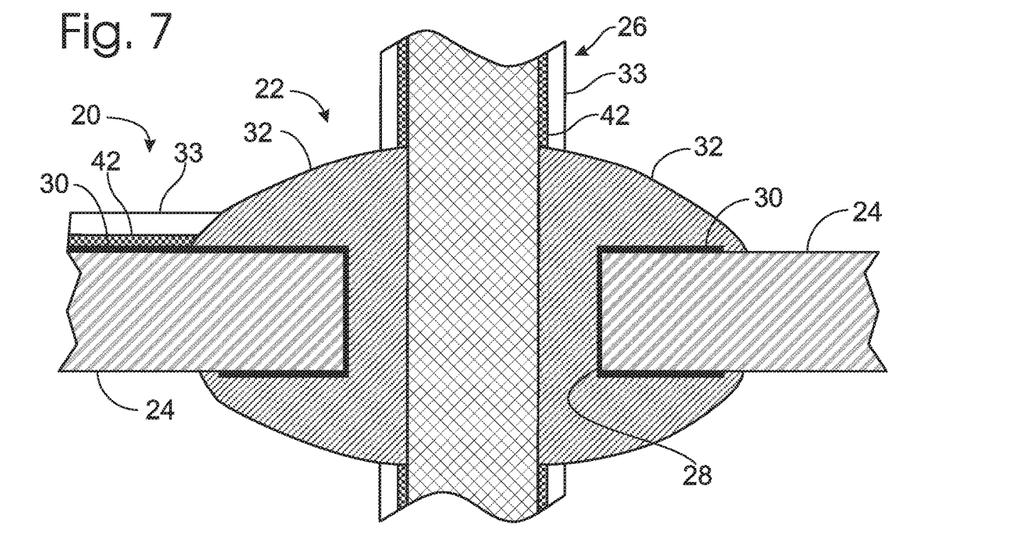
FIG. 7 includes a cross-sectional view of a detail of an electronic connection in an alternative electronic assembly, after preparation but prior to curing of that assembly, according to an exemplary embodiment of the invention.

In an alternative embodiment, as depicted in FIG. 7 for an electronic assembly before curing, a mitigating agent formed as a metal film 42 is applied to copper metal 30 that is typically formed as conductive traces 20 of an electronic assembly, as well as component lead 26. During subsequent application of the component finish, pure tin metal 33 forms a film on mitigating agent film 42 where it has been applied. As it is shielded from conductive trace 20, tin metal 33 no longer interacts with the copper metal of the trace.

The metal mitigating agent may be applied to the substrate of an electronic assembly prior to the addition of electronic components to the substrate. Alternatively, the metal mitigating agent may be applied to the electronic assembly after one or more electronic components are coupled to the substrate via electrical connections. The metal mitigating agent may be inert with respect to forming an alloy with pure tin metal until and unless the electronic assembly is subjected to appropriate conditions for alloy formation (curing). Those conditions may be selected to form a tin metal alloy consuming substantially all pure tin metal present adjacent the metal mitigating agent, provided that a sufficient amount of the metal mitigating agent is present to form such an amount of alloy. The tin alloy formed by interaction of tin metal with the metal mitigating agent is resistant to whisker formation. This resistance may be due to the tin alloy having an overall tin content of less than about 97% by weight. In one embodiment of the method, the mitigating agent is a metal that is at least one of gallium, indium, gold, copper, aluminum, silver, magnesium, nickel, zinc, and lead.

Figure 8:
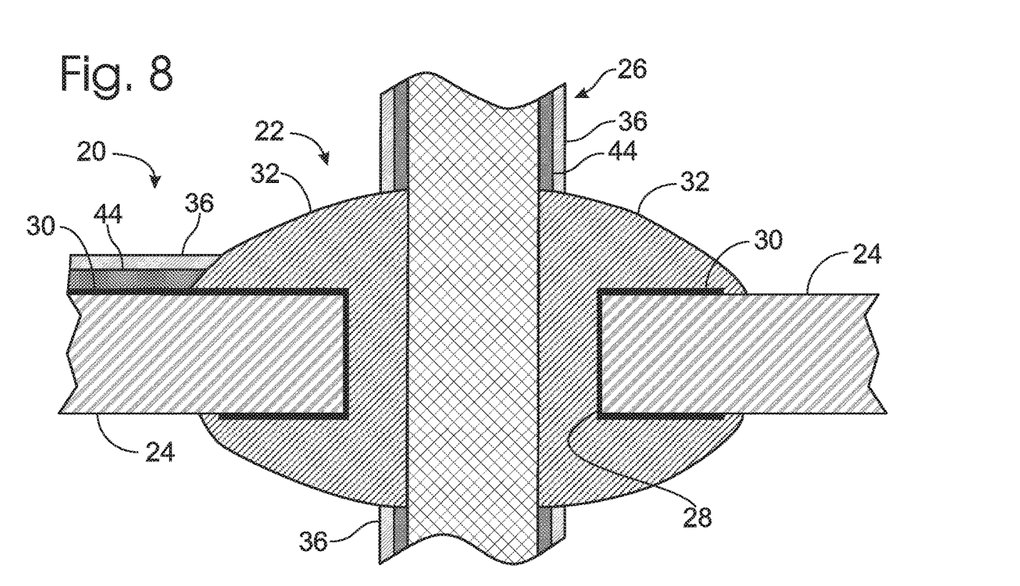
FIG. 8 is a detail of the electronic assembly of FIG. 7 after completing a curing process, and showing complete conversion of tin metal to whisker-resistant products, according to another exemplary embodiment of the invention.

With reference to FIG. 7, post-assembly curing of the electronic assembly results in an interaction between tin metal 33 and the metal film of mitigating agent 42, thereby forming a tin alloy 44 that is resistant to whisker formation. FIG. 8 depicts the electrical connection of FIG. 7 after surface treatment with a reactive mitigating agent, and after curing is substantially complete. As shown in FIG. 8, all pure tin metal in electrical connection 22 has been converted to a whisker-resistant product. Specifically, all tin metal present has been converted to either tin alloy 44 or whisker-resistant product 36, as described above.

In one version, the invention may include a whisker-resistant electronic assembly. The electronic assembly is resistant to the formation of tin whiskers by virtue of being prepared by a process that includes providing an electronic assembly having at least one electrical connection that includes substantially pure tin metal, exposing the tin metal to a mitigating agent selected to interact with the tin metal to produce a product that is resistant to forming whiskers, and curing the electronic assembly under conditions selected to promote the desired interaction. For example, the electronic assembly may be exposed to a mitigating agent that is an oxidizing agent, the curing of the electronic assembly may include heating the electronic assembly, and the product of the interaction of the tin metal with the oxidizing agent may be a tin oxide.

Where the electronic assembly may have previously formed one or more tin-whisker-type structures before complete conversion/exhaustion of Sn metal and before treatment with an oxidizing agent, the preparation of the electronic assembly may include exposure of the electronic assembly to an oxidizing agent, curing the electronic assembly, and then removing any tin-whisker-type structures that have been derivatized, or altered chemically or metallurgically, such as by being converted to tin oxide, as set out at 44 in flowchart 10 of FIG. 1. Such structures would typically be both fragile and non-conductive, and could be removed by a number of methods, including for example vibration and/or exposure to a jet of high velocity gas, such as nitrogen gas or clean air. Alternatively or in addition, a gentle vacuum may be used to remove fragments of oxidized tin whisker structures.

In yet another embodiment, the invention may include a whisker-resistant electronic assembly that is resistant to the formation of tin whiskers by virtue of being prepared by a process that includes coupling at least one conducting trace with tin metal with a mitigating metal that is at least one of gallium, indium, gold, copper, aluminum, silver, magnesium, nickel, zinc, and lead. The mitigating metal is present in sufficient quantity that upon heating, it substantially converts the tin metal to an alloy that is resistant to whisker formation. In this embodiment, the tin metal may be converted to an alloy that is resistant to whisker formation by heating the electronic assembly to a temperature between about 25° C. and about 90° C.

The depiction of electrical connection 22 in FIGS. 4-8 should be considered to be illustrative only, and is intended to aid in understanding the invention. The relative size or thickness of a given component or layer are illustrative and not necessarily representational.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    providing an electronic assembly, the electronic assembly having at least one electrical connection that includes at least a surface that is substantially pure tin metal wherein, the pure tin metal has preformed tin whiskers formed thereon and wherein the pure tin metal has a thickness;
    exposing the tin metal to at least one mitigating agent selected to interact with the tin metal to oxidize the preformed tin whiskers; and
    mechanically removing substantially all the oxidized tin whiskers from the electronic assembly, wherein mechanically removing substantially all the oxidized tin whiskers comprises an action selected from the group consisting of: vibrating the electronic assembly to remove substantially all the oxidized tin whiskers and applying a gas flow over the electronic assembly sufficient to separate the oxidized tin whiskers from the surface of the electronic assembly; and
    wherein the electronic assembly is exposed to the mitigating agent under appropriate conditions to oxidize the tin whiskers.

2. The method of claim 1, wherein the mitigating agent is a reagent, and the interaction with the tin metal is a chemical reaction.

3. The method of claim 2, wherein the mitigating agent is oxygen, and the interaction with tin metal is oxidation of the tin metal to at least one of $SnO$ and $SnO_2$.

4. The method of claim 3, wherein the appropriate conditions include heating the electronic assembly above room temperature.

5. The method of claim 4, wherein the appropriate conditions include heating the electronic assembly to between about 25° C. and about 90° C.

6. The method of claim 2, wherein the appropriate conditions are sufficient to convert the tin metal surface of the at least one electrical connection to a product that is resistant to forming whiskers.

7. The method of claim 2, wherein the appropriate conditions are sufficient to convert the surface and entire thickness of the at least one electrical connection to a product that is resistant to forming whiskers.

8. The method of claim 1, wherein the mitigating agent is applied to the electronic assembly as one or more of a vapor and liquid.

9. The method of claim 1, wherein a first mitigating agent is a reagent that interacts with the tin metal in a chemical reaction at the surface of the tin metal, and a second mitigating agent is a metal film disposed between the tin metal and the at least one electrical connection that interacts with an underside of the tin metal to form a tin alloy that is resistant to forming whiskers.

10. The method of claim 1, wherein mechanically removing substantially all the oxidized tin whiskers from the electronic assembly comprises vibrating the electronic assembly at a frequency and amplitude that the oxidized tin whiskers break free of the electronic assembly.

11. The method of claim 10, further comprising exposing the oxidized tin whiskers to a vacuum sufficient to remove one or more of oxidized tin whiskers separated from the electronic assembly and oxidized tin whiskers attached to the electronic assembly.

12. The method of claim 1, wherein mechanically removing substantially all the oxidized tin whiskers from the electronic assembly comprises exposing the oxidized tin whiskers to a jet of high velocity gas.

13. The method of claim 12, wherein the high velocity gas comprises one or more of nitrogen and air.

14. The method of claim 12, further comprising exposing the oxidized tin whiskers to a vacuum sufficient to remove one or more of oxidized tin whiskers separated from the electronic assembly and oxidized tin whiskers attached to the electronic assembly.

15. The method of claim 1, wherein mechanically removing substantially all the oxidized tin whiskers from the electronic assembly comprises exposing the oxidized tin whiskers to a vacuum, the vacuum causing gas surrounding the oxidized whiskers to move past the oxidized tin whiskers with a velocity sufficient to remove the oxidized tin whiskers.

16. A method comprising:
providing an electronic assembly, the electronic assembly having at least one electrical connection that includes at least a surface that is substantially pure tin metal wherein, the pure tin metal has tin whiskers preformed thereon and wherein the pure tin metal has a thickness;
heating the electronic assembly to between about 25° C. and about 90° C.;
exposing the tin metal to at least one mitigating agent selected to interact with the tin metal to oxidize the preformed tin whiskers, the mitigating agent comprising oxygen and the interaction with the tin metal is a chemical reaction comprising oxidation of the tin metal to at least one of SnO and SnO$_2$; and
mechanically removing substantially all the oxidized tin whiskers from the electronic assembly, wherein mechanically removing substantially all the oxidized tin whiskers comprises an action selected from the group consisting of: vibrating the electronic assembly to remove substantially all the oxidized tin whiskers and applying a gas flow over the electronic assembly sufficient to separate the oxidized tin whiskers from the surface of the electronic assembly.

17. The method of claim 16, wherein mechanically removing substantially all the oxidized tin whiskers from the electronic assembly comprises vibrating the electronic assembly at a frequency and amplitude that the oxidized tin whiskers break free of the electronic assembly.

18. The method of claim 16, wherein mechanically removing substantially all the oxidized tin whiskers from the electronic assembly comprises exposing the oxidized tin whiskers to a jet of high velocity gas.

19. The method of claim 16, wherein mechanically removing substantially all the oxidized tin whiskers from the electronic assembly comprises exposing the oxidized tin whiskers to a vacuum, the vacuum causing gas surrounding the oxidized whiskers to move past the oxidized tin whiskers with a velocity sufficient to remove the oxidized tin whiskers.

20. A method comprising:
providing an electronic assembly, the electronic assembly having at least once electrical connection that includes at least a surface that is substantially pure tin metal, wherein the pure tin metal has a thickness, the method comprising:
exposing the tin metal to at least one metal mitigating agent selected to interact with the tin metal to produce a tin alloy that is resistant to forming tin whiskers;
wherein the electronic assembly is exposed to the metal mitigating agent under appropriate conditions to convert the tin metal into a tin alloy and wherein exposing the tin metal to at least one metal mitigating agent comprises heating the electronic assembly to between about 25 C and about 90 C to facilitate oxidation of the tin metal.

21. The method of claim 20, wherein the electronic assembly includes a mitigating agent that is a conducting layer of copper metal, and the tin alloy that is formed includes one or more of $Cu_6Sn_5$ and $CuSn_3$.

22. The method of claim 20, wherein the mitigating agent is at least one of gallium, indium, gold, copper, aluminum, silver, magnesium, nickel, zinc, and lead.

23. The method of claim 20, wherein the tin alloy is less than about 97% tin.

24. The method of claim 20, wherein the electronic assembly further includes a circuit board and at least one electronic component coupled by the at least one electrical connection.

25. The method of claim 24, wherein the mitigating agent is applied to the electronic assembly prior to coupling the electronic component to the electrical connection.

26. The method of claim 24, wherein the mitigating agent is applied to the electronic assembly after the electronic component is coupled to the electrical connection.

* * * * *